(12) United States Patent
Liu et al.

(10) Patent No.: US 11,556,155 B2
(45) Date of Patent: Jan. 17, 2023

(54) TOUCHPAD MODULE AND COMPUTING DEVICE USING SAME

(71) Applicant: Primax Electronics Ltd., Taipei (TW)

(72) Inventors: Hsin-Chih Liu, Taipei (TW); Wei-Chiang Huang, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 255 days.

(21) Appl. No.: 17/082,500

(22) Filed: Oct. 28, 2020

(65) Prior Publication Data

US 2022/0050500 A1   Feb. 17, 2022

(30) Foreign Application Priority Data

Aug. 14, 2020   (TW) .................................. 109127776

(51) Int. Cl.
| G06F 3/041 | (2006.01) |
| G06F 1/16 | (2006.01) |
| H05K 7/14 | (2006.01) |

(52) U.S. Cl.
CPC .............. *G06F 1/169* (2013.01); *G06F 3/041* (2013.01); *H05K 7/1417* (2013.01)

(58) Field of Classification Search
CPC ...... G06F 1/169; G06F 3/041; G06F 3/03547; H05K 7/1417
See application file for complete search history.

(56) References Cited

U.S. PATENT DOCUMENTS

| 2007/0139388 A1* | 6/2007 | Lee ......................... G06F 1/169 |
| | | 345/173 |
| 2010/0302153 A1* | 12/2010 | Jung ................... G06F 3/03547 |
| | | 345/158 |
| 2019/0243475 A1* | 8/2019 | Huang .................. G06F 1/1681 |
| 2020/0203100 A1* | 6/2020 | Huang ................ G06F 3/03547 |
| 2020/0333917 A1* | 10/2020 | Lu ............................ G06F 1/169 |

* cited by examiner

*Primary Examiner* — Lunyi Lao
*Assistant Examiner* — Jarurat Suteerawongsa
(74) *Attorney, Agent, or Firm* — Kirton McConkie; Evan R. Witt

(57) ABSTRACT

A touchpad module includes a bracket, a touch member and a supporting plate. The supporting plate is arranged between the bracket and the touch member. When an end of the touch member is pressed down, the end of the touch member is swung relative to the bracket through the supporting plate. The supporting plate includes a plate body, at least one supporting part and a swingable part. The plate body, the at least one supporting part and the swingable part are integrally formed as a one-piece structure. The present invention further provides a computing device with the touchpad module.

13 Claims, 7 Drawing Sheets

TOUCHPAD MODULE AND COMPUTING DEVICE USING SAME

FIELD OF THE INVENTION

The present invention relates to an input device, and more particularly to an input device with a touch control function.

BACKGROUND OF THE INVENTION

With increasing development of science and technology, a variety of electronic devices are designed in views of convenience and user-friendliness. For helping the user well operate the electronic devices, the electronic devices are gradually developed in views of humanization. The common electronic devices include for example notebook computers, mobile phones, satellite navigation devices, or the like. Recently, the storage capacity and the processor's computing performance for these electronic devices are largely enhanced, and thus their functions become more powerful and complicated. For efficiently operating an electronic device, a touchpad is used as an input device of the electronic device for controlling the operations of the electronic device.

FIG. 1 schematically illustrates a conventional notebook computer with a touchpad module. As shown in FIG. 1, the touchpad module 1 is installed on a casing 21 of the notebook computer 2. Moreover, at least a portion of the touchpad module 1 is exposed outside so as to be touched by the user's finger. Consequently, the user may operate the touchpad module 1 to control the notebook computer 2. For example, in case that the user's finger is placed on the touchpad module 1 and slid on the touchpad module 1, a cursor 23 shown on a display screen 22 of the notebook computer 2 is correspondingly moved. Moreover, in case that the touchpad module 1 is pressed down by the user's finger, the notebook computer 2 executes a specified function. The use of the touchpad module 1 can implement some functions of the conventional mouse. In other words, the user may operate the notebook computer 2 through the touchpad module 1 without the need of additionally carrying or installing the mouse.

Please refer to FIGS. 2 and 3. FIG. 2 is a schematic cross-sectional view illustrating the touchpad module as shown in FIG. 1, in which the touchpad module is not pressed down. FIG. 3 is a schematic cross-sectional view illustrating the touchpad module as shown in FIG. 2, in which the touchpad module is pressed down. The touchpad module 1 comprises a touch member 11, a bracket 12 and a supporting assembly 13. A switch element 113 is installed on a bottom side of a first end 111 of the touch member 11. The bracket 12 is located under the touch member 11. Moreover, the bracket 12 is fixed in an accommodation space (not shown) of the casing 21 through fastening elements such as screws (not shown). The supporting assembly 13 is arranged between a second end 112 of the touch member 11 and the bracket 12. While a first end 111 of the touch member 11 is swung, the supporting assembly 13 is used as a fulcrum.

The supporting assembly 13 comprises a metal support block 131 and a thin metal elastic sheet 132. The thin metal elastic sheet 132 is arranged between the metal support block 131 and the touch member 11 and partially protruded outside the metal support block 131. The metal support block 131 is a supporting structure for supporting the thin metal elastic sheet 132 and the touch member 11. When the first end 111 of the touch member 11 is pressed down, the portion of the thin metal elastic sheet 132 protruded out of the metal support block 131 is subjected to deformation. Consequently, the first end 111 of the touch member 11 is swung downwardly relative to the bracket 12 to trigger the switch element 113 (see FIG. 3). When the first end 111 of the touch member 11 is no longer pressed by the user, the first end 111 of the touch member 11 is swung upwardly in response to an elastic force of the thin metal elastic sheet 132. Consequently, the touchpad module 1 is returned to its original position.

However, the touch member 11 of the conventional touchpad module 1 has the following drawbacks. For example, since the supporting assembly 13 has a large number of components, it difficult to control the accumulated tolerance and the components are easily separated from each other. Moreover, due to the arrangement of the metal support block 131, the touchpad module 1 is heavy, thick and costly.

In other words, the conventional touchpad module and the conventional computing device with the touchpad module need to be further improved.

SUMMARY OF THE INVENTION

An object of the present invention provides a touchpad module with a supporting plate. The supporting plate is a one-piece structure. Consequently, the material number, the assembling procedure and the tolerance in the fabricating process are reduced, and the thickness of the touchpad module and the fabricating cost are reduced.

Another object of the present invention provides a computing device with the touchpad module.

In accordance with an aspect of the present invention, a touchpad module is provided. The touchpad module includes a bracket, a touch member and a supporting plate. The switch element is installed on a bottom side of a first end of the touch member. The supporting plate includes a plate body, at least one supporting part and a swingable part. The plate body, the at least one supporting part and the swingable part are integrally formed as a one-piece structure. The plate body is arranged between a second end of the touch member and the bracket. Each supporting part is a raised structure that is protruded from the plate body in a direction toward the bracket. The swingable part is protruded externally from a portion of a lateral edge of the plate body. When the first end of the touch member is pressed down, the first end of the touch member is swung relative to the plate body through the swingable part, so that the switch element is triggered.

In accordance with another aspect of the present invention, a computing device is provided. The computing device includes a casing, a processor and a touchpad module. An accommodation space is concavely formed in the casing. The processor is disposed within the casing. The touchpad module is disposed within the accommodation space and electrically connected with the processor. The touchpad module includes a bracket, a touch member and a supporting plate. The switch element is installed on a bottom side of a first end of the touch member. The supporting plate includes a plate body, at least one supporting part and a swingable part. The plate body, the at least one supporting part and the swingable part are integrally formed as a one-piece structure. The plate body is arranged between a second end of the touch member and the bracket. Each supporting part is a raised structure that is protruded from the plate body in a direction toward the bracket. The swingable part is protruded externally from a portion of a lateral edge of the plate body. When the first end of the touch member is pressed down, the first end of the touch member is swung relative to the plate body through the swingable part, so that the switch element is triggered.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
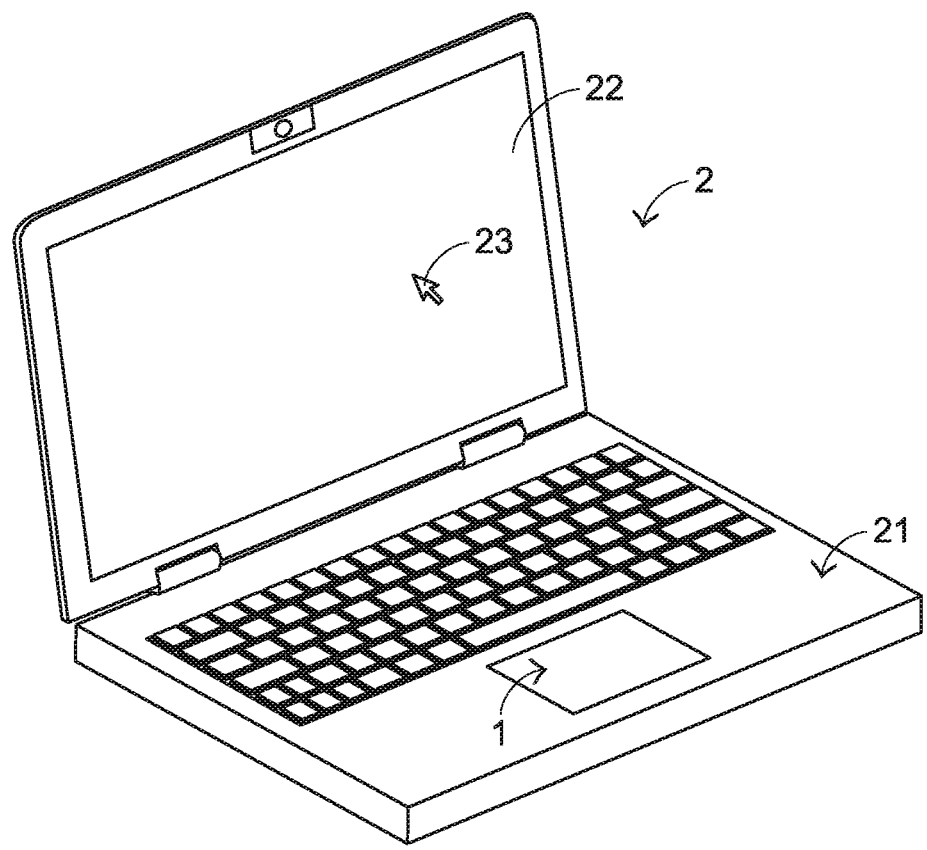
FIG. 1 schematically illustrates a conventional notebook computer with a touchpad module.
Figure 2:
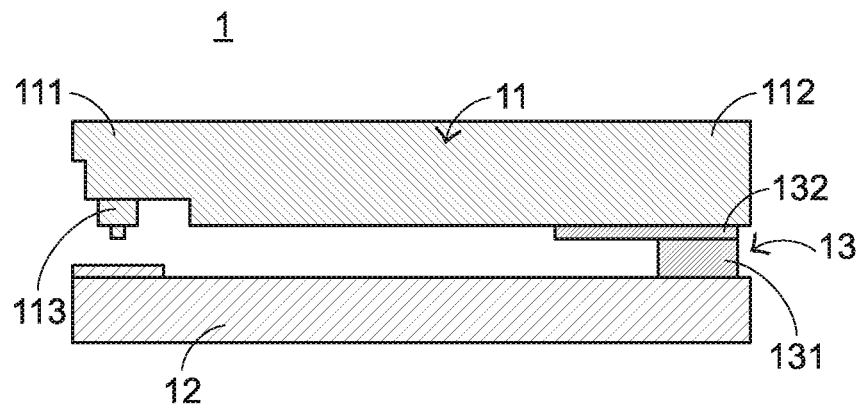
FIG. 2 is a schematic cross-sectional view illustrating the touchpad module as shown in FIG. 1, in which the touchpad module is not pressed down.
Figure 3:
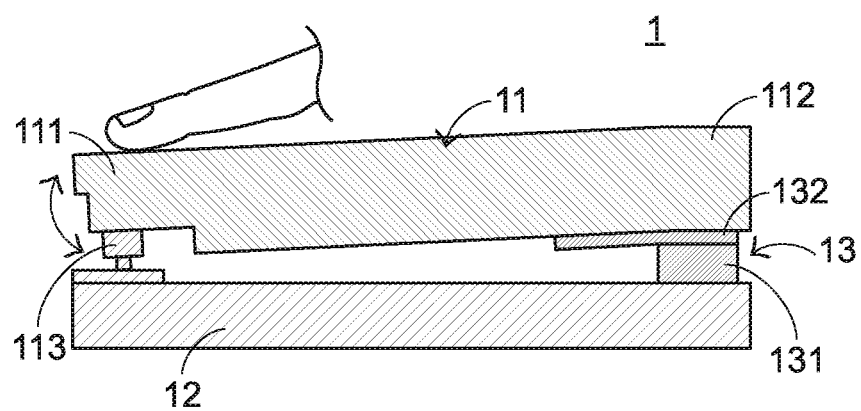
FIG. 3 is a schematic cross-sectional view illustrating the touchpad module as shown in FIG. 2, in which the touchpad module is pressed down.

The embodiments of present invention will be described more specifically with reference to the following drawings. Generally, in the drawings and specifications, identical or similar components are designated by identical numeral references. For well understanding the present invention, the elements shown in the drawings are not in scale with the elements of the practical product. In the following embodiments and drawings, the elements irrelevant to the concepts of the present invention or the elements well known to those skilled in the art are omitted. It is noted that numerous modifications and alterations may be made while retaining the teachings of the invention.

Figure 4:
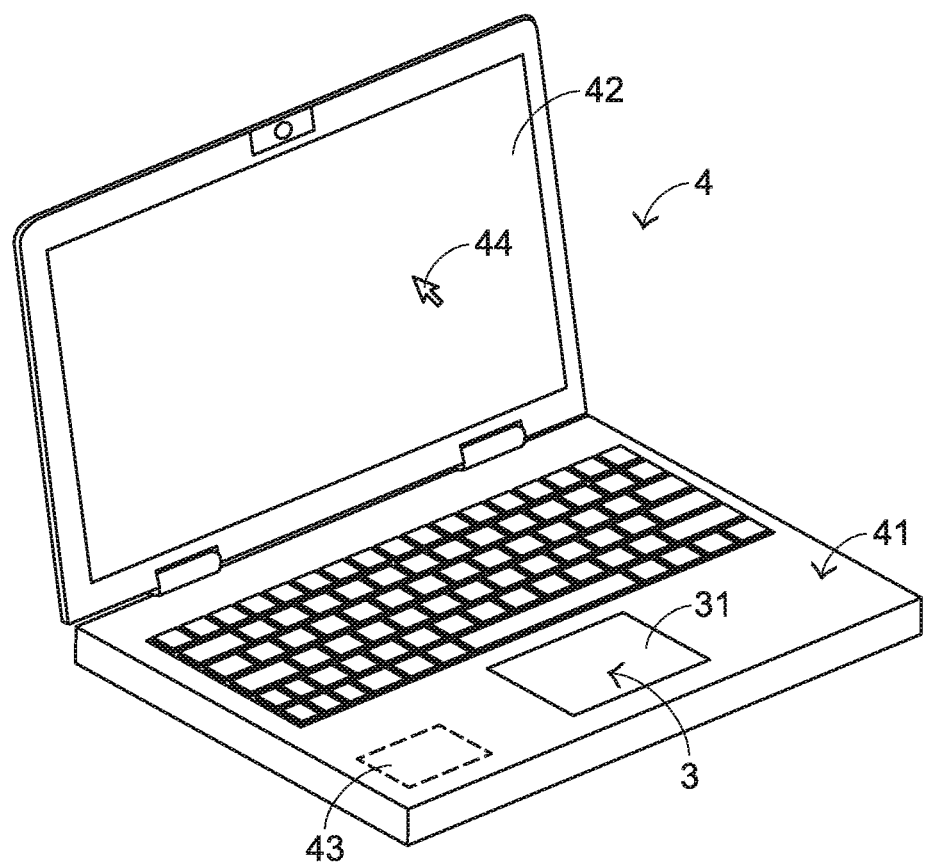
FIG. 4 is a schematic perspective view illustrating the outer appearance of a computing device with a touchpad module according to a first embodiment of the present invention.

FIG. 4 is a schematic perspective view illustrating the outer appearance of a computing device with a touchpad module according to a first embodiment of the present invention. An example of the computing device 4 includes but is not limited to a notebook computer. In an embodiment, the computing device 4 comprises a casing 41, a display screen 42, a processor 43 and a touchpad module 3. Moreover, an accommodation space is concavely formed in the casing 41. The touchpad module 3 is disposed within the accommodation space and electrically connected with the processor 43. Moreover, at least a portion of the touchpad module 3 is exposed outside so as to be touched by the user's finger. Consequently, the user may operate the touchpad module 3 to control the computing device 4. For example, in case that the user's finger is placed on the touchpad module 3 and slid on the touchpad module 3, a cursor 44 shown on the display screen 42 is correspondingly moved. Moreover, in case that the touchpad module 3 is clicked (or pressed) by the user's finger, the computing device 4 executes a specified function.

Figure 5:
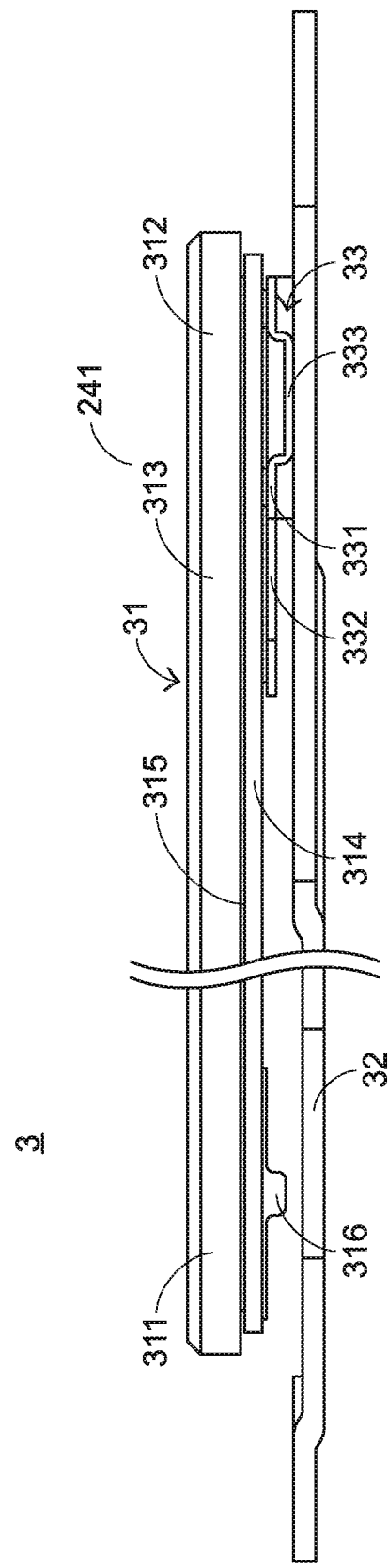
FIG. 5 is a schematic side view illustrating the touchpad module of the computing device as shown in FIG. 4.
Figure 6:
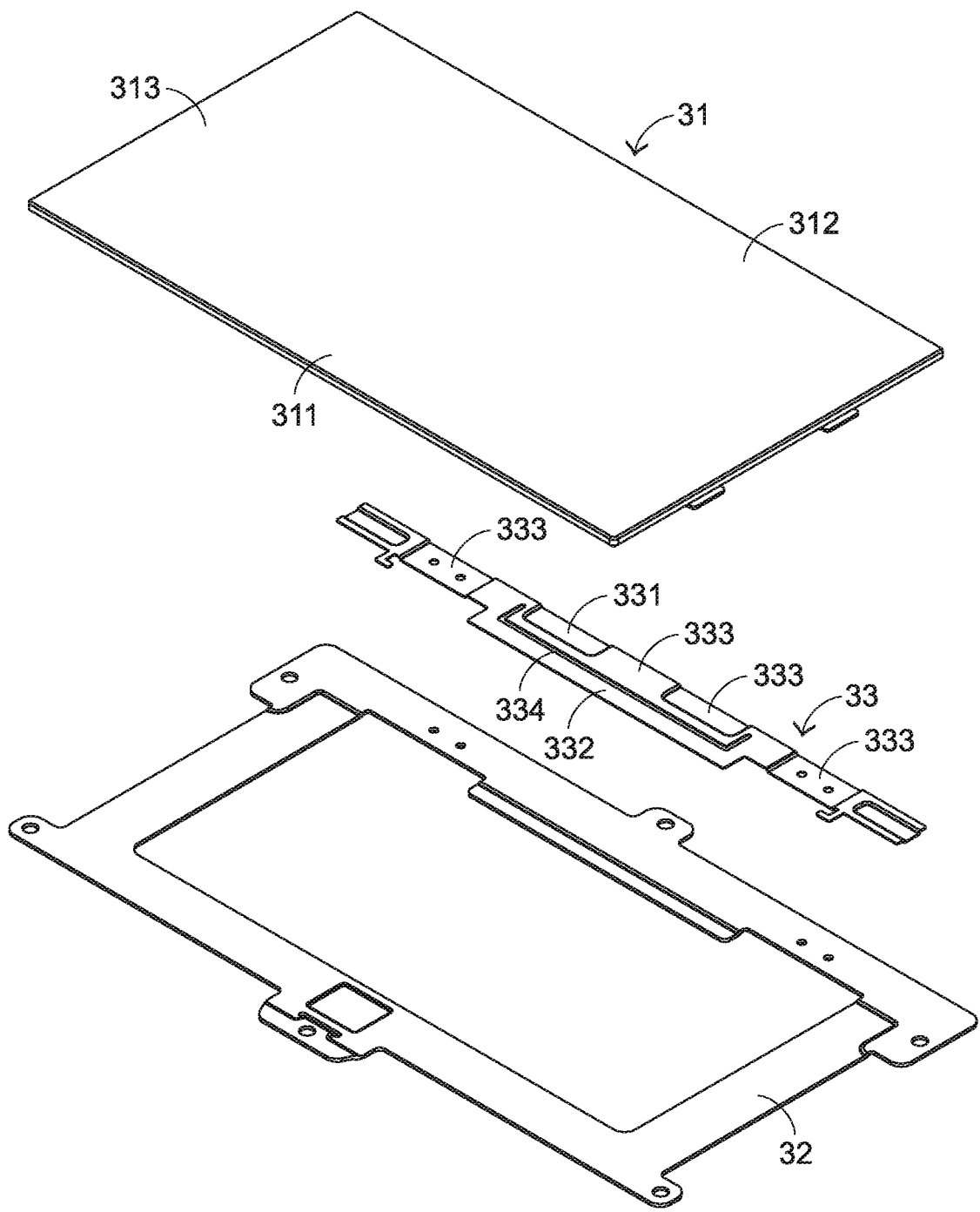
FIG. 6 is a schematic exploded view illustrating a portion of the touchpad module as shown in FIG. 5.

Please refer to FIGS. 5 and 6. FIG. 5 is a schematic side view illustrating the touchpad module of the computing device as shown in FIG. 4. FIG. 6 is a schematic exploded view illustrating a portion of the touchpad module as shown in FIG. 5. The touchpad module 3 comprises a touch member 31, a bracket 32 and a supporting plate 33. The bracket 32 is located under the touch member 31. Moreover, the bracket 32 is fixed in the casing 41 through fastening elements such as screws (not shown). The supporting plate 33 is arranged between a second end 312 of the touch member 31 and the bracket 32. The supporting plate 33 is used for supporting the touch member 31. Consequently, a first end 311 of the touch member 31 can be swung upwardly or downwardly relative to the bracket 32 through the supporting plate 33.

In an embodiment, the touch member 31 comprises a covering plate 313, a circuit board 314 and a switch element 316. The circuit board 314 is located under the covering plate 313. The switch element 316 is installed on a bottom surface of the circuit board 314. The covering plate 313 and the circuit board 314 are combined together through an adhesive layer 315. A top surface of the covering plate 313 is exposed outside to be touched and operated by the user. When the circuit board 314 senses the touching behavior of the user on the covering plate 313, the circuit board 314 issues a corresponding electronic signal to the processor 43 of the computing device 4. According to the electronic signal, the computing device 4 executes a corresponding command. Preferably but not exclusively, the covering plate 313 is a glass covering plate or a plastic covering plate, and the adhesive layer 315 is made of a pressure sensitive adhesive (PSA).

Figure 7:
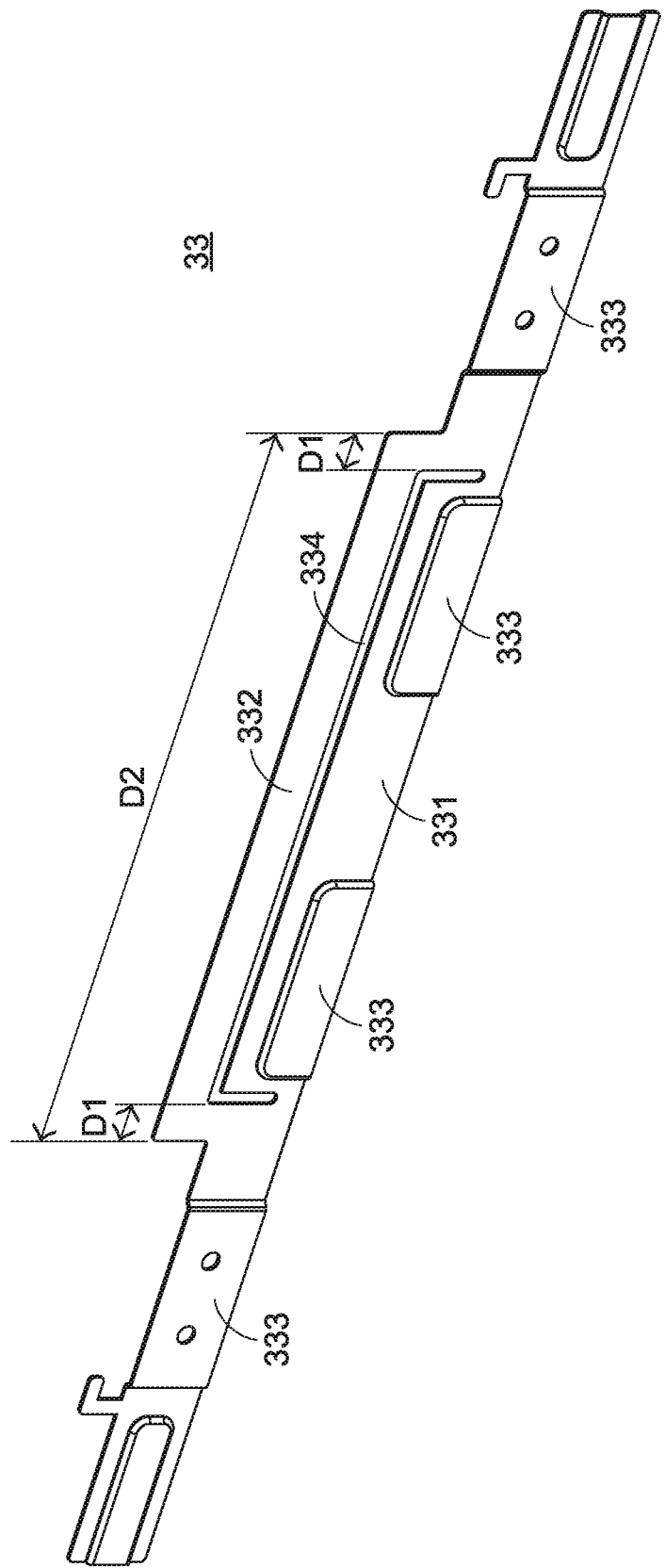
FIG. 7 is a schematic perspective view illustrating the supporting plate of the touchpad module as shown in FIG. 6 and taken along another viewpoint.

FIG. 7 is a schematic perspective view illustrating the supporting plate of the touchpad module as shown in FIG. 6 and taken along another viewpoint. The supporting plate 33 comprises a plate body 331, a swingable part 332 and plural supporting parts 333. The plural supporting parts 333 are discretely arranged. In this embodiment, the plate body 331, the swingable part 332 and the plural supporting parts 333 are integrally formed as a one-piece structure. The plate body 331 is arranged between the second end 312 of the touch member 31 and the bracket 32. The supporting parts 333 are raised structures that are protruded from the plate body 331 in the direction toward the bracket 32. The swingable part 332 is protruded externally from a portion of a lateral edge of the plate body 331.

In an embodiment, the supporting plate 33 is made of metallic material. For example, the supporting plate 33 is an iron element. The swingable part 332 has a strip-like structure. The plate body 331 is connected with the circuit board 314 of the touch member 31 through a pressure sensitive adhesive (PSA) 317. Moreover, at least a portion of the supporting part 333 is connected with the bracket 32 through a laser welding process. It is noted that the material of the supporting plate 33, the shape of the swingable part 332 of the supporting plate 33 and the connection between the swingable part 332, the touch member 31 and the bracket 32 are not restricted.

The operations of the touchpad module 3 will be described as follows. While the first end 311 of the touch member 31 is pressed down, the plate body 331 and the swingable part 332 are supported by the supporting part 333 of the supporting plate 33. As the touchpad module 3 is moved downwardly, the swingable part 332 is swung downwardly relative to the plate body 331. Consequently, the first end 311 of the touch member 31 is swung downwardly by using the supporting plate 33 as a fulcrum. When the switch element 316 is pushed by the bracket 32, the switch element 316 is triggered. At the same time, the circuit board 314 connected with the switch element 316 issues a corresponding electronic signal to the processor 43 of the computing device 4. According to the electronic signal, the computing device 4 executes a corresponding command. When the first end 311 of the touch member 31 is not pressed down, the first end 311 of the touch member 31 is swung upwardly in response to the elastic force of the deformed swingable part 332 of the supporting plate 33. Consequently, the first end 311 of the touch member 31 is returned to its original position.

Preferably but not exclusively, the supporting plate 33 of the touchpad module 3 is equipped with an elongated slot 334 between the swingable part 332 and the plate body 331. The distance between any end of the elongated slot 334 and the corresponding end of the strip-like swingable part 332 is D1. The distance between the two ends of the swingable part 332 is D2. The minimum pressing force (i.e., the minimum force for triggering the switch element 316) may be influenced by the distance D1, the distance D2 and the thickness of the supporting plate 33. That is, by properly designing the distance D1, the distance D2 and the thickness of the supporting plate 33, the minimum pressing force of the touchpad module 3 is adjustable.

From the above descriptions, the supporting plate 33 of the touchpad module 3 is used for supporting the touch member 31 and allowing the touch member 31 to be swung relative to the bracket 32. Since the supporting plate 33 is a one-piece structure, the material number, the assembling procedure and the tolerance in the fabricating process are reduced. In addition, the thickness of the touchpad module and the fabricating cost are reduced.

Figure 8:
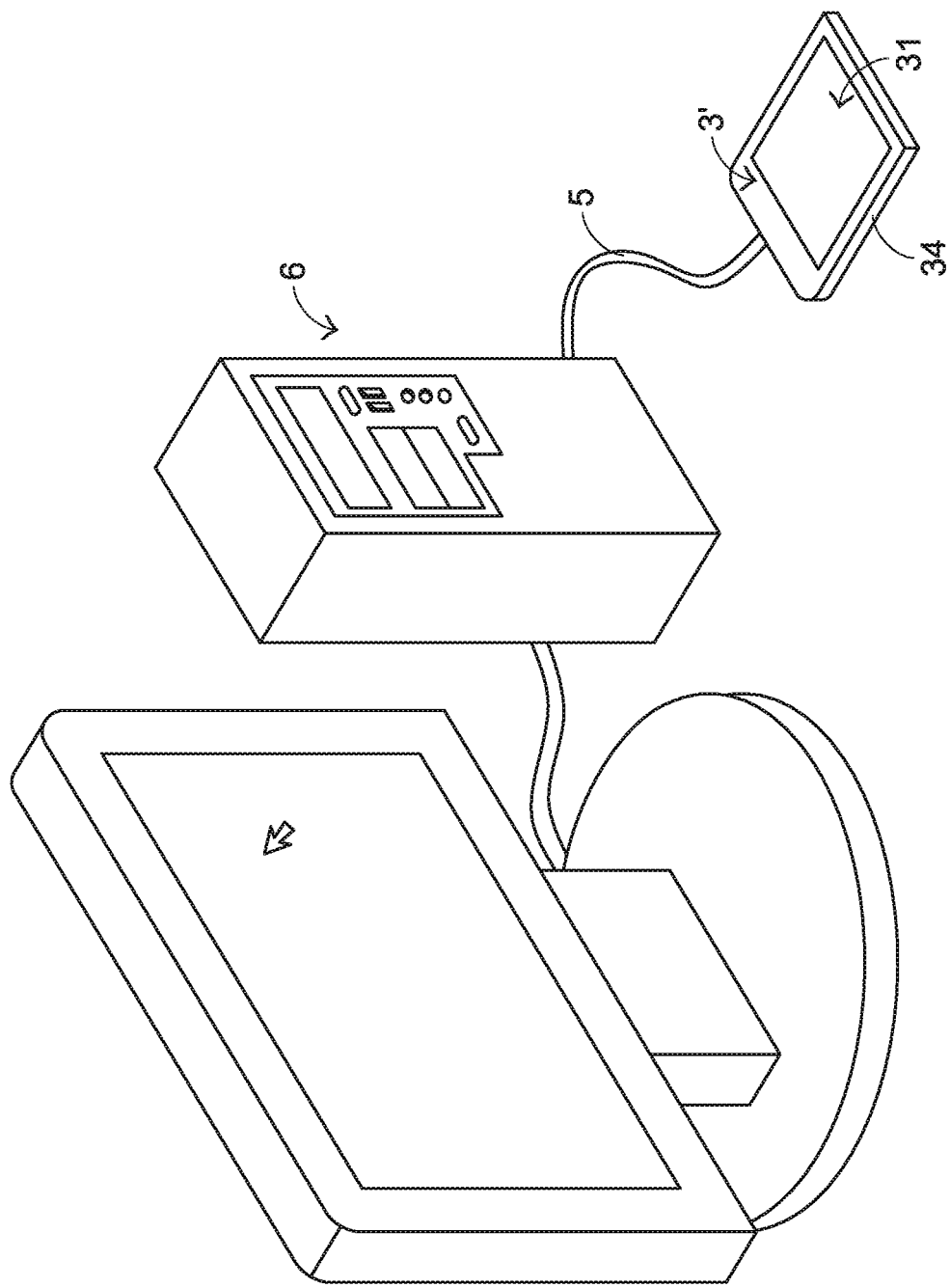
FIG. 8 schematically illustrates a touchpad module for a computing device according to a second embodiment of the present invention.

In the above embodiments, the touchpad module is installed in the computing device. It is noted that numerous modifications and alterations may be made while retaining the teachings of the invention. FIG. 8 schematically illustrates a touchpad module for a computing device according to a second embodiment of the present invention. As shown in FIG. 8, the touchpad module 3' is an external input device that is independent from the computing device. The touchpad module 3' is in communication with a desktop computer 6 through a signal communication interface 5. For example, the signal communication interface 5 is a universal serial bus (USB). In comparison with the touchpad module 3 of the above embodiment, the touchpad module 3' of this embodiment further comprises an outer shell 34. The outer shell 34 is an individual component for accommodating the touch member 31, the bracket 32 and the supporting plate 33. The structures of the other components of the touchpad module 3' are identical to those of the above embodiment, and not redundantly described herein.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A touchpad module, comprising:
    a bracket;
    a touch member, wherein a switch element is installed on a bottom side of a first end of the touch member; and
    a supporting plate comprising a plate body, at least one supporting part and a swingable part, wherein the plate body, the at least one supporting part and the swingable part are integrally formed as a one-piece structure, the plate body is arranged between a second end of the touch member and the bracket, each supporting part is a raised structure that is protruded from the plate body in a direction toward the bracket, and the swingable part is protruded externally from a portion of a lateral edge of the plate body, wherein when the first end of the touch member is pressed down, the first end of the touch member is swung relative to the plate body through the swingable part, so that the switch element is triggered,
    wherein the swingable part has a strip-like structure, and a minimum pressing force applied to the touch member is determined according to a distance between two ends of the strip-like structure,
    wherein the supporting plate further comprises an elongated slot between the swingable part and the plate body, wherein the minimum pressing force applied to the touch member is determined according to a distance between an end of the elongated slot and the corresponding end of the strip-like structure.

2. The touchpad module according to claim 1, wherein the at least one supporting part comprises plural supporting parts, and the plural supporting parts are discretely arranged.

3. The touchpad module according to claim 1, wherein the at least one supporting part is connected with the bracket through a laser welding process.

4. The touchpad module according to claim 1, wherein the plate body is connected with the touch member through a pressure sensitive adhesive.

5. The touchpad module according to claim 1, wherein the touch member comprises a covering plate and a circuit board, wherein the covering plate is located over the circuit board, at least a portion of the covering plate is exposed outside a casing, and the switch element is installed on a bottom surface of the circuit board.

6. The touchpad module according to claim 5, wherein the covering plate is a glass covering plate or a plastic covering plate, and the covering plate and the circuit board are combined together through an adhesive layer.

7. The touchpad module according to claim 5, wherein the casing is included in a computing device, or the touchpad module contains the casing.

8. A computing device, comprising:
    a casing, wherein an accommodation space is concavely formed in the casing;
    a processor disposed within the casing; and
    a touchpad module disposed within the accommodation space and electrically connected with the processor, wherein the touchpad module comprises:
    a bracket;
    a touch member, wherein a switch element is installed on a bottom side of a first end of the touch member; and
    a supporting plate comprising a plate body, at least one supporting part and a swingable part, wherein the plate body, the at least one supporting part and the swingable part are integrally formed as a one-piece structure, the plate body is arranged between a second end of the touch member and the bracket, each supporting part is a raised structure that is protruded from the plate body in a direction toward the bracket, and the swingable part is protruded externally from a portion of a lateral edge of the plate body, wherein when the first end of the touch member is pressed down, the first end of the touch member is swung relative to the plate body through the swingable part, so that the switch element is triggered, wherein the swingable part has a strip-like structure, and a minimum pressing force applied to the touch member is determined according to a distance between two ends of the strip-like structure, wherein the supporting plate further comprises an elongated slot between the swingable part and the plate body, wherein the minimum pressing force applied to the touch member is determined according to a distance between an end of the elongated slot and the corresponding end of the strip-like structure.

9. The computing device according to claim 8, wherein the at least one supporting art comprises plural supporting parts, and the plural supporting parts are discretely arranged.

10. The computing device according to claim 8, wherein the at least one supporting part is connected with the bracket through a laser welding process.

11. The computing device according to claim 8, wherein the plate body is connected with the touch member through a pressure sensitive adhesive.

12. The computing device according to claim 8, wherein the touch member comprises a covering plate and a circuit board, wherein the covering plate is located over the circuit board, at least a portion of the covering plate is exposed outside a casing, and the switch element is installed on a bottom surface of the circuit board.

13. The computing device according to claim 12, wherein the covering plate is a glass covering plate or a plastic covering plate, and the covering plate and the circuit board are combined together through an adhesive layer.

* * * * *